United States Patent [19]
Fujii et al.

[11] Patent Number: 4,822,639
[45] Date of Patent: Apr. 18, 1989

[54] SPIN COATING METHOD AND DEVICE

[75] Inventors: Itsuo Fujii; Toshikazu Sato; Kazuharu Kawashima, all of Saitama, Japan

[73] Assignee: Fuji Photo Film Co., Ltd., Kanagawa, Japan

[21] Appl. No.: 88,052

[22] Filed: Aug. 21, 1987

[30] Foreign Application Priority Data

Aug. 25, 1986 [JP] Japan ................ 61-197417

[51] Int. Cl.$^4$ .................. B05D 3/12; B05C 13/00
[52] U.S. Cl. ..................... 427/240; 118/52; 437/231
[58] Field of Search ............ 427/240; 118/53, 52, 118/54; 437/221

[56] References Cited

U.S. PATENT DOCUMENTS

| | | | |
|---|---|---|---|
| 3,672,932 | 6/1972 | D'Augustine | 427/240 |
| 4,124,411 | 11/1978 | Meuleman et al. | 427/240 |
| 4,468,410 | 8/1984 | Zeya | 427/240 |

Primary Examiner—Janyce Bell
Attorney, Agent, or Firm—Jules E. Goldberg

[57] ABSTRACT

In coating a substrate such as a glass plate with a photosensitive coating solution by spin coating, the substrate is tilted so that the coating solution flows down the substrate to cover the entire surface of the latter, and then the substrate is held horizontal, and rotated so that a layer of coating solution uniform in thickness is formed on the substrate.

6 Claims, 1 Drawing Sheet

SPIN COATING METHOD AND DEVICE

BACKGROUND OF THE INVENTION

1. Field of the Invention

This invention relates to a spin coating method which is extensively employed in the field of manufacture of semiconductor devices, and to a spin coating device for practicing the method.

2. Background of the Invention

Heretofore, in the field of manufacture of semiconductor devices, a coating solution of photosensitive material such as photo-resist or a gelatinous silver halide emulsion is applied by a spin coating method to a substrate, such as a silicon wafer or photo mask blank made up of a glass plate with a metal film.

A spin coating device for practicing the spin coating method, as shown in FIG. 2, comprises a turn table 4 on which is placed a substrate 1 to be coated with the coating solution. A vertical rotary shaft 5 rotates the turn table 4. An electric motor 6 rotates the vertical rotary shaft 5.

The spin coating device is operated as follows. A solution supplying nozzle 3 for supplying the coating solution is set above the center of the turn table 4.

After the substrate 1 is placed on the turn table 4, a predetermined amount of coating solution 2 is supplied onto the substrate 1 through the nozzle 3. Thereafter, the turn table 4 is rotated at low speed until the coating solution 2 spreads over the entire surface of the substrate 1. In succession to this operation, the turn table 4 is rotated at high speed so that a layer of coating solution 2 is formed on the substrate 1 to a desired thickness.

In the case where the substrate 1 is relatively small in size (for instance, three or four inches maximum), or a kind of photoresist coating solution is used, the above-described method has no problem at all.

However, it has been found that, in the case where the substrate is relatively large, at least five or six inches, or another king of coating solution is used, it is impossible to form a layer of coating solution of uniform in thickness by the above described method.

For instance, in the case where the coating solution 2 is a silver halide emulsion with a gelatin binder, the film formed on the central portion of the substrate where the coating solution is first supplied is clearly different in thickness from the film which is formed on the other portion, namely, the peripheral portion, after the coating solution 2 is spread by rotation of the turn table 4.

This phenomenon is significant especially in the application of a silver halide emulsion onto the substrate. That is, when the substrate is not sufficiently wetted by the coating solution, the film formed on the substrate is not uniform in thickness. The portions of the film which are different in thickness are different also in sensitivity and in developing speed, and therefore the resultant image is not uniform in line width. Accordingly, the characteristic of a semiconductor device formed using the image is different from the desired one.

In order to eliminate the above-described difficulties, Japanese Patent Application Publication No. 13377/1981 has disclosed a method in which a coating solution of gelatinous silver halide emulsion is substantially uniformly applied to the substantially entire surface of a substrate held horizontally and then the substrate is rotated. More specifically, in the method, the coating solution is spread manually or automatically. In the manual method, the coating solution is manually spread over the entire surface of the substrate with a bar. In the automatic method, a number of coating-solution supplying nozzles are juxtaposed along one side of the substrate. The nozzles thus arranged are moved towards the opposite side so that the entire surface of the substrate is coated with the coating solution. Alternatively, a number of coating-solution supplying nozzles are arranged over the substrate to simultaneously coat it with the coating solution. In a still further automatic method, one coating-solution supplying nozzle is set above the substrate, and it is moved over the substrate while applying the coating solution through it.

In order to coat the substrate uniformly, it is necessary to cover about 50% to 80% of the area of the substrate with the supplied coating solution. It takes a relatively long period of time to cover the area with a single nozzle. Therefore, it is necessary to arrange a number of solution coating nozzles over the substrate, or to move a solution coating nozzle over it. That is, the coating device needs a relatively intricate mechanism to quickly cover about 50% to 80% of the area of the substrate with the coating solution. Especially in the case where the coating solution is a gelatin silver halide emulsion, it is not smoothly spread over the substrate. In order to allow a coating solution of this type to smoothly spread over the substrate, the coating solution must be supplied through the solution supplying nozzle more than is actually required. That is, the coating solution is uneconomically used.

SUMMARY OF THE INVENTION

Accordingly, an object of this invention is to eliminate the above-described difficulties accompanying a conventional spin coating method.

More specifically, an object of the invention is to provide a spin coating method which is simple and economically uses a coating solution. A further object is to provide a spin coating device for practicing the method.

The foregoing object and other objects of the invention have been achieved by the provision of a spin coating method in which, after a photosensitive coating solution is supplied onto a substrate, the substrate is rotated around a vertical rotational axis to form a layer of photosensitive coating solution on the substrate. According to the invention, the substrate is initially tilted. The coating solution is supplied through a solution supplying nozzle to the substrate thus tilted in such a manner that the coating solution flows down the substrate to cover the entire surface of the substrate. Immediately thereafter the substrate is held horizontal again and then rotated.

The apparatus of the invention is a spin coating device comprises a turn table on which a substrate to be coated with a coating solution is placed and a vertical rotary shaft for rotating the turn table. According to the invention, the device further comprises means for tilting the substrate.

BRIEF DESCRIPTION OF THE DRAWINGS

The nature, principle and utility of the invention will become more apparent from the following detailed description when read in conjunction with the accompanying drawing.

In the accompanying drawings.

DESCRIPTION OF THE INVENTION

This invention will be described with reference to the accompanying drawings in detail.

Figure 1A:
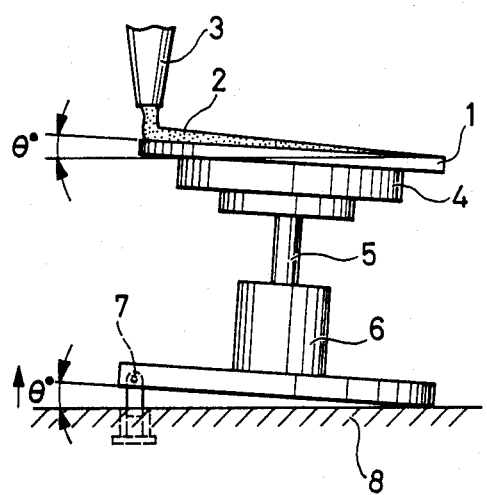
FIG. 1(a) is a side view showing one example of a spin coating device according to this invention which is tilted for spreading a coating solution over a substrate placed on the turn table of the device.
Figure 1B:
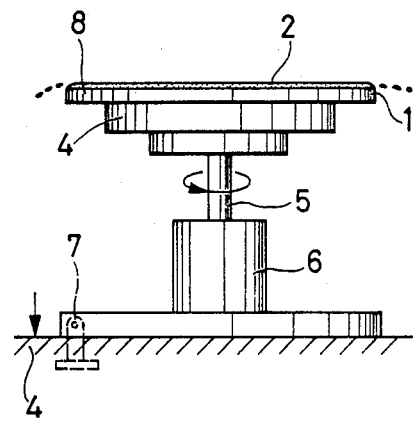
FIG. 1(b) is a side view showing the turn table which is held horizontal again and turned to form a layer of coating solution uniform in thickness thereon.
Figure 2:
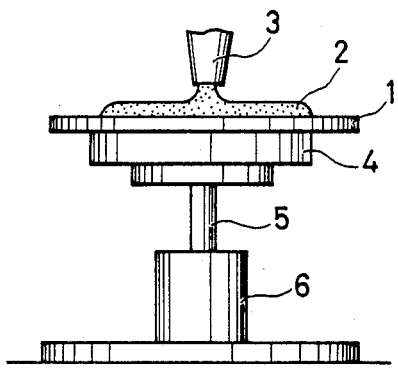
FIG. 2 is a side view showing one example of a conventional spin coating device onto the turn table of which a coating solution is being supplied.

FIGS. 1(a) and 1(b) show one example of a spin coating device according to the invention. The spin coating device comprises a turn table 4 on which a substrate 1 to be coated is placed, a vertical rotary shaft 5 for rotating the turn table 4, and tilting means 7 for tilting the turn table 4 and accordingly the substrate 1.

The tilting means 7 has a lifting mechanism at one side of the turn table 4, such as a pneumatic or a solenoid device, installed on an installation base 8. The lifting mechanism is operated to tilt the spin coating device so that the substrate 1 placed on the turn table 4 forms an angle $\theta$ of from 3° to 5° with respect to a horizontal plane ($\theta = 3°$ to 5°). A coating-solution supplying nozzle 3 having a slit-shaped outlet corresponding to the length of the upper edge of the substrate thus tilted is held above the upper edge of the substrate to supply a predetermined quantity of a coating solution 2 onto the substrate 1. The coating solution 2 thus supplied flows down the substrate 1 from the upper edge to the lower edge so that a thin layer of coating solution is formed on the entire surface of the substrate 1. Immediately the tilting means 7 is operated to hold the turn table 4, and hence the substrate 1, horizontal again, as shown in FIG. 1(b). Under this condition, an electric motor 6 is driven to turn the rotary shaft 5 and to hence turn the substrate 1 on the turn table 4. As the turn table 4 is rotated by the motor 6, a surplus of coating solution is splashed away from the substrate 1 by centrifugal force, so that a coating solution layer is formed on the substrate to a desired thickness.

In the invention, the term "substrate" as used herein intended to include, among other possibilities, a glass plate covered with a metal film, a plastic film, a silicon wafer and a glass plate.

The photosensitive coating solution applied to the substrate may be photo-resist with organic solvent as a coating solvent or a gelatinous silver halide emulsion.

The turn table of the spin coating device may have means for sucking and retaining or holding the substrate so that when the substrate is held horizontal and turned around the vertical rotating axis, the substrate may not come off the turn table.

The rotary shaft 5 can be rotated at a speed in a range of 100 rpm to 6000 rpm. For instance, when the photoresist which smoothly spreads over the substrate is used, the rotary shaft is turned at a low speed (100 rpm to 1000 rpm) for spreading the coating solution over the substrate, and then it is turned at a high speed (2000 rpm to 6000 rpm) to form a layer of coating solution uniform in thickness on the substrate.

In the invention, the substrate tilting means includes a mechanism which lifts one side of the spin coating device, thereby to tilt the substrate as shown in FIG. 1(a). An alternative mechanism is one which, with the spin coating device body held horizontal, lifts one side of the substrate holding mechanism of the turn table. Yet a further mechanism is one in which the coating solution is supplied onto the tilted substrate before the substrate is placed on the turn table. Then the substrate is set on the horizontal spin coating device.

The angle $\theta$ of inclination of the substrate may be in a range of from 2° to 10°, preferably from 3° to 5°. The angle $\theta$ depends on the viscosity of a coating solution used or how smoothly the coating solution spreads over the substrate. In the case where the coating solution has a low viscosity or smoothly spreads over the substrate, the angle of inclination may be in a range of from 2° to 4°. In the case where the coating solution is high in viscosity or does not smoothly spread over the substrate, the angle of inclination should be in a range of from 5° to 10°.

In the method of the invention, the quantity of coating solution supplied onto the substrate 1 is about $\frac{1}{2}$ to 1/5 of that in the conventional method. Furthermore, in the method of the invention, the time required for spreading the coating solution over the entire surface of the substrate in the conventional method is eliminated, although the time is used for making the coating solution layer uniform in thickness. Accordingly, the time required for coating the substrate in the method of the invention is reduced to about a half ($\frac{1}{2}$) of the time required in the conventional method. Furthermore, since the coating solution is applied to the entire surface of the substrate, even a square substrate can be uniformly coated with the solution without making the corners thicker.

As was described above, in the invention, the substrate placed on the spin coating device is tilted, the coating solution is allowed to flow down the substrate from the upper edge so that the coating solution is spread over the entire surface of the substrate. Immediately the substrate is held horizontal again for spinning and is rotated by the motor. Therefore, the quantity of coating solution per substrate can be greatly reduced; that is, the coating solution can be used economically. Furthermore, the coating time is short, and the yield is increased. In addition, the equipment can be simple when compared with that in the conventional method. Moreover, the layer formed over the substrate is uniform in thickness even at the corners.

What is claimed is:

1. A spin coating method, comprising the steps of:
   supplying a coating solution to a periphery of substrate tilted with respect to a horizontal place, whereby said coating solution flows across said substrate and then;
   holding said substrate, including said flowed coating solution, parallel to said horizontal plane; and then
   rotating said substrate, while parallel to said horizontal plane, about a vertical axis perpendicular to said horizontal plane for distributing said coating solution over said substrate.

2. A spin coating method as recited in claim 1, wherein said substrate is tilted at an angle of from 3° to 5° with respect to said horizontal plane.

3. A spin coating device, comprising:
   a turntable for supporting a substrate coated with a coating solution;
   means for moving between a first position in which the turntable is in a horizontal plane and a second position in which the turntable is tilted at an angle to the horizontal plane; and
   a vertical rotary shaft for rotating said turntable and means for coating a substrate comprising a single nozzle disposed above a periphery of the turntable while it is in the second position on the turntable with a coating solution by the action of gravity.

4. A spin coating device as recited in claim 3, wherein said moving means tilts said turntable through an angle of from 3° to 5°.

5. A spin coating device as recited in claim 3, where said moving means tilts said turntable supporting thereon said substrate.

6. A spin coating device as recited in claim 5, wherein said moving means tilts said turntable through an angle of from 3° to 5°.

* * * * *